United States Patent
Cignoli et al.

(10) Patent No.: US 11,563,319 B1
(45) Date of Patent: Jan. 24, 2023

(54) STAND-ALONE SAFETY ISOLATED AREA WITH INTEGRATED PROTECTION FOR SUPPLY AND SIGNAL LINES

(71) Applicant: STMicroelectronics S.r.l., Agrate Brianza (IT)

(72) Inventors: Marco Cignoli, Pavia (IT); Nicola Errico, Rho (IT); Paolo Vilmercati, Pavia (IT); Stefano Castorina, Milan (IT); Enrico Ferrara, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/490,285

(22) Filed: Sep. 30, 2021

(51) Int. Cl.
*H02H 3/16* (2006.01)
*G05F 1/56* (2006.01)
*H02H 1/00* (2006.01)

(52) U.S. Cl.
CPC ............. *H02H 3/16* (2013.01); *G05F 1/56* (2013.01); *H02H 1/0007* (2013.01)

(58) Field of Classification Search
CPC ..... F02D 2041/2027; F02D 2041/2058; F02D 41/20; G05F 1/561; G06F 2117/02; G06F 30/30; H01F 2007/1888; H01F 7/1844; H01H 47/325; H01L 21/76224; H01L 27/0207; H01L 29/0642; H01L 29/0649; H02H 1/0007; H02H 3/087; H02H 3/202; H02H 7/20; H02M 1/0009; H02M 3/1555; H02M 3/156
See application file for complete search history.

(56) References Cited

U.S. PATENT DOCUMENTS

| | | | |
|---|---|---|---|
| 9,638,744 B2 * | 5/2017 | Bernon-Enjalbert | H01L 29/0649 |
| 2015/0331040 A1 * | 11/2015 | Bernon-Enjalbert | H01L 29/0649 438/424 |
| 2020/0212664 A1 * | 7/2020 | Takuma | H03K 19/00384 |

* cited by examiner

Primary Examiner — Jared Fureman
Assistant Examiner — Nicolas Bellido
(74) Attorney, Agent, or Firm — Crowe & Dunlevy

(57) ABSTRACT

Disclosed herein is a single integrated circuit chip with a main logic that operates a vehicle component such as a valve driver. Isolated from the main logic within the chip is a safety area that operates to verify proper operation of the main logic. The safety area is internally powered by an internal regulated voltage generated by an internal voltage regulator that generates the internal regulated voltage from an external voltage while protecting against shorts of the external line delivering the external voltage. The safety area includes protection circuits that level shift external analog signals downward in voltage for monitoring within the safety area, the protection circuits serving to protect against shorts of the external line delivering the external analog signals.

21 Claims, 3 Drawing Sheets

STAND-ALONE SAFETY ISOLATED AREA WITH INTEGRATED PROTECTION FOR SUPPLY AND SIGNAL LINES

TECHNICAL FIELD

This disclosure is related to the field of test circuitry and, in particular, to test circuitry within dedicated "safety areas" within integrated circuit chips that is powered by a protected internal integrated voltage supply and has protection circuitry to protect input signal lines against shorts to high voltage.

BACKGROUND

Modern vehicles increasingly are equipped with a variety of safety systems, particularly in view of the fact that such modern vehicles increasingly utilize drive-by-wire controls to receive driver input. For example, instead of a vehicle's steering wheel, brake pedal, and gas pedal being mechanically connected to a hydraulic or cable system for controlling the vehicle, one or more of such controls may be connected to a sensing apparatus that communicates the driver's intent to a controller, which in turn effectuates the driver's intent, potentially with modifications for safety.

For example, when a driver presses on the gas pedal to request that rotational torque be applied to the drive wheels of the vehicle, instead of the gas pedal operating a cable that mechanically operates components of the vehicle's engine (e.g., throttle blade), the gas pedal may cooperate with a sensor apparatus to generate an electrical output that is ultimately provided to a transmission controller and a throttle blade controller. The transmission controller, for example, in turn controls the vehicle's transmission, for example by actuating valve drivers that control shifting of the gears of the transmission. Since this transmission controller is actually in control of the transmission rather than the driver, it is desired for fault detection to be performed to determine whether the controller is operating properly.

As a consequence of this desire for safety in the view of drive-by-wire vehicle controls, the ISO 26262 standard was developed to include the Automotive Safety Integrity Level (ASIL) risk classification scheme. The ASIL levels range from ASIL-A (lowest) to ASIL-D (highest). An ASIL level is determined by three factors, namely the severity of a failure, the probability of a failure occurring, and the ability for the effect of the failure to be controlled.

For vehicle components that directly control the movement of the vehicle, such as the transmission and braking systems, ASIL-D applies, and not only are faults to be meticulously detected but the circuits and components used to check for those faults are also to be checked and verified for proper operation.

One of the most common requirements under ASIL-D for transmission controllers is to guarantee a safe switch-off of a power stage, such as may include failsafe pre-drivers and valve drivers. The switch-off is to be guaranteed even in case the common switch-off path, usually implemented via an interaction between logic core and analog driver blocks in the power stage, is not working due to a fault. For this reason, a redundant switch-off path and redundant switch-off circuitry is generally implemented. This redundant switch-off path is generally integrated within a protected area isolated through a deep trench isolation. This protected area is commonly known as a "Safety Area".

One such arrangement may be seen in FIG. 1. Here, a vehicle system 10 includes a main logic 11, such as a transmission controller, in communication with safety circuits 13 inside a safety area 12. The safety circuits 13 determine whether the main logic 11 is operating correctly and provide for an alternative switch-off path in the event of a detected failure.

The safety circuits 13 within the safety area 12 are to operate completely independently from other functions within the main logic 11 and integrated circuit chip 10, and as such their designs include, among other features, independent isolated voltage. Current designs achieve this goal by fully isolating supply lines that enter the safety area 12 from the rest of the integrated circuit chip 10, which therefore requires a separate isolated power pin to avoid a fault that is able to effect both the safety area 12 and the blocks driven by the safety area 12, and involve a large amount of die area for isolating the supply lines. While this does address the concern, the drawbacks are not desirable for certain applications, and therefore additional development into this area is needed.

SUMMARY

Disclosed herein is an integrated circuit chip, including: an integrated circuit substrate; main logic within the integrated circuit substrate, the main logic configured to control at least one external component, the main logic further configured to generate at least one digital signal from which proper operation of the main logic can be determined, and at least one analog signal from which proper operation of the main logic can be determined; and a safety area within the integrated circuit substrate and isolated from the main logic. The safety area includes: an internal voltage regulator configured to receive an external supply voltage via an external supply voltage line and from it generate an internal regulated voltage, the internal voltage regulator configured to protect circuits within the safety area from shorts of the external supply voltage line to other voltages; and a protection circuit configured to receive at least one analog signal over an external analog input line and to generate at least one analog fault signal from the at least one analog signal by level shifting the at least one analog signal downward in voltage to produce at least one analog fault signal, the protection circuit configured to protect circuits within the safety area from shorts of the external analog input line to other voltages. The safety area also includes safety circuits powered by the internal regulated voltage and configured to: generate, from the at least one analog fault signal, at least one analog internal signal indicating whether improper operation of the main logic has occurred; generate, from the at least one digital signal, at least one digital fault signal indicating whether improper operation of the main logic has occurred; and generate, based upon the at least one analog internal signal and the at least one digital fault signal, an output signal that causes the at least one external component to perform a desired function in response to improper operation of the main logic, and a feedback signal that indicates that improper operation of the main logic has not occurred.

The protection circuit may include an input resistor coupled to a level shifter, with a cathode of an avalanche diode being coupled to a tap between the input resistor and the level shifter and an anode of the avalanche diode being coupled to ground, wherein the level shifter is configured to shift the voltage of the at least one analog signal downward to produce at least one analog fault signal.

The avalanche diode may be a Zener diode.

The internal voltage regulator may include: a reference voltage generator connected between an internal node and ground, the internal node being coupled to the external supply voltage line, the reference voltage generator configured to generate a reference voltage from the external supply voltage on the external supply voltage line; an avalanche diode coupled between the internal node and ground, the avalanche diode configured to protect the internal voltage regulator from shorts of the external supply voltage line to other voltages; and a cascode circuit coupled to the reference voltage as input and configured to generate the internal regulated voltage from the external supply voltage.

The internal voltage regulator may also include a voltage divider coupled between the external supply voltage line and ground, with a tap of the voltage divider being coupled to the internal node.

The internal voltage regulator may also include a first resistor coupled between the external supply voltage line and the internal node, and a second resistor coupled between the internal node and ground.

The cascode circuit may include: a first transistor having a first conduction terminal coupled to the external supply voltage line, a second conduction terminal, and a control terminal coupled to the internal node; and a second transistor having a first conduction terminal coupled to the second conduction terminal of the first transistor, a second conduction terminal at which the internal regulated voltage is produced, and a control terminal coupled to the internal node.

The cascode circuit may include: a first n-channel transistor having a drain coupled to the external supply voltage, a source, and a gate coupled to the internal node; and a second n-channel transistor having a drain coupled to the source of the first n-channel transistor, a source coupled to ground, and a gate coupled to the internal node.

The reference voltage generator may include a plurality of diode coupled transistors connected between the internal node and ground.

The reference voltage generator may include: a first n-channel transistor having a drain coupled to the internal node, a source, and a gate coupled to the internal node; a second n-channel transistor having a drain coupled to the source of the first n-channel transistor, a source, and a gate coupled to the source of the first n-channel transistor; and a third n-channel transistor having a drain coupled to the source of the second n-channel transistor, a source coupled to ground, and a gate coupled to the source of the second n-channel transistor.

The safety area may be isolated by at least one deep trench isolation.

The safety area may be isolated by at two concentric deep trench isolations.

Disclosed herein is an integrated circuit chip, including: an integrated circuit substrate; main logic within the integrated circuit substrate, the main logic configured to control at least one external component; and a safety area within the integrated circuit substrate and surrounded by at least one deep trench isolation. The safety area may include an internal voltage regulator having: a reference voltage generator connected between an internal node and ground, the internal node being coupled to an external supply voltage line to receive an external supply voltage, the reference voltage generator configured to generate a reference voltage from the external supply voltage on the external supply voltage line; an avalanche diode coupled between the internal node and ground, the avalanche diode configured to protect the internal voltage regulator from shorts of the external supply voltage line to other voltages; and a cascode circuit coupled to the reference voltage as input and configured to generate the internal regulated voltage from the external supply voltage. A protection circuit includes an input resistor coupled to a level shifter, with a cathode of an avalanche diode being coupled to a tap between the input resistor and the level shifter and an anode of the avalanche diode being coupled to ground, wherein the level shifter is configured to shift the voltage of at least one analog signal received over an external analog input line from outside the safety downward to produce at least one analog fault signal. Safety circuits are powered by the internal regulated voltage and configured to indicate to the at least one external component whether the main logic has experienced a fault.

The internal voltage regulator may include a voltage divider coupled between the external supply voltage line and ground, with a tap of the voltage divider being coupled to the internal node.

The internal voltage regulator may include a first resistor coupled between the external supply voltage line and the internal node, and a second resistor coupled between the internal node and ground.

The cascode circuit may include: a first transistor having a first conduction terminal coupled to the external supply voltage line, a second conduction terminal, and a control terminal coupled to the internal node; and a second transistor having a first conduction terminal coupled to the second conduction terminal of the first transistor, a second conduction terminal at which the internal regulated voltage is produced, and a control terminal coupled to the internal node.

The cascode circuit may include: a first n-channel transistor having a drain coupled to the external supply voltage, a source, and a gate coupled to the internal node; and a second n-channel transistor having a drain coupled to the source of the first n-channel transistor, a source coupled to ground, and a gate coupled to the internal node.

The reference voltage generator may include a plurality of diode coupled transistors connected between the internal node and ground.

The reference voltage generator may include: a first n-channel transistor having a drain coupled to the internal node, a source, and a gate coupled to the internal node; a second n-channel transistor having a drain coupled to the source of the first n-channel transistor, a source, and a gate coupled to the source of the first n-channel transistor; and a third n-channel transistor having a drain coupled to the source of the second n-channel transistor, a source coupled to ground, and a gate coupled to the source of the second n-channel transistor.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead.

Figure 1:
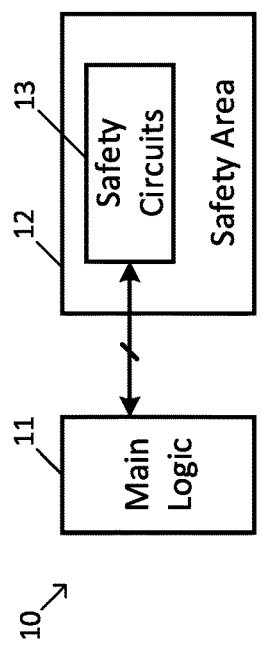
FIG. 1 is a block diagram of a prior art integrated circuit chip utilizing an internal isolated safety area for verifying proper operation of main logic within the integrated circuit chip.
Figure 2:
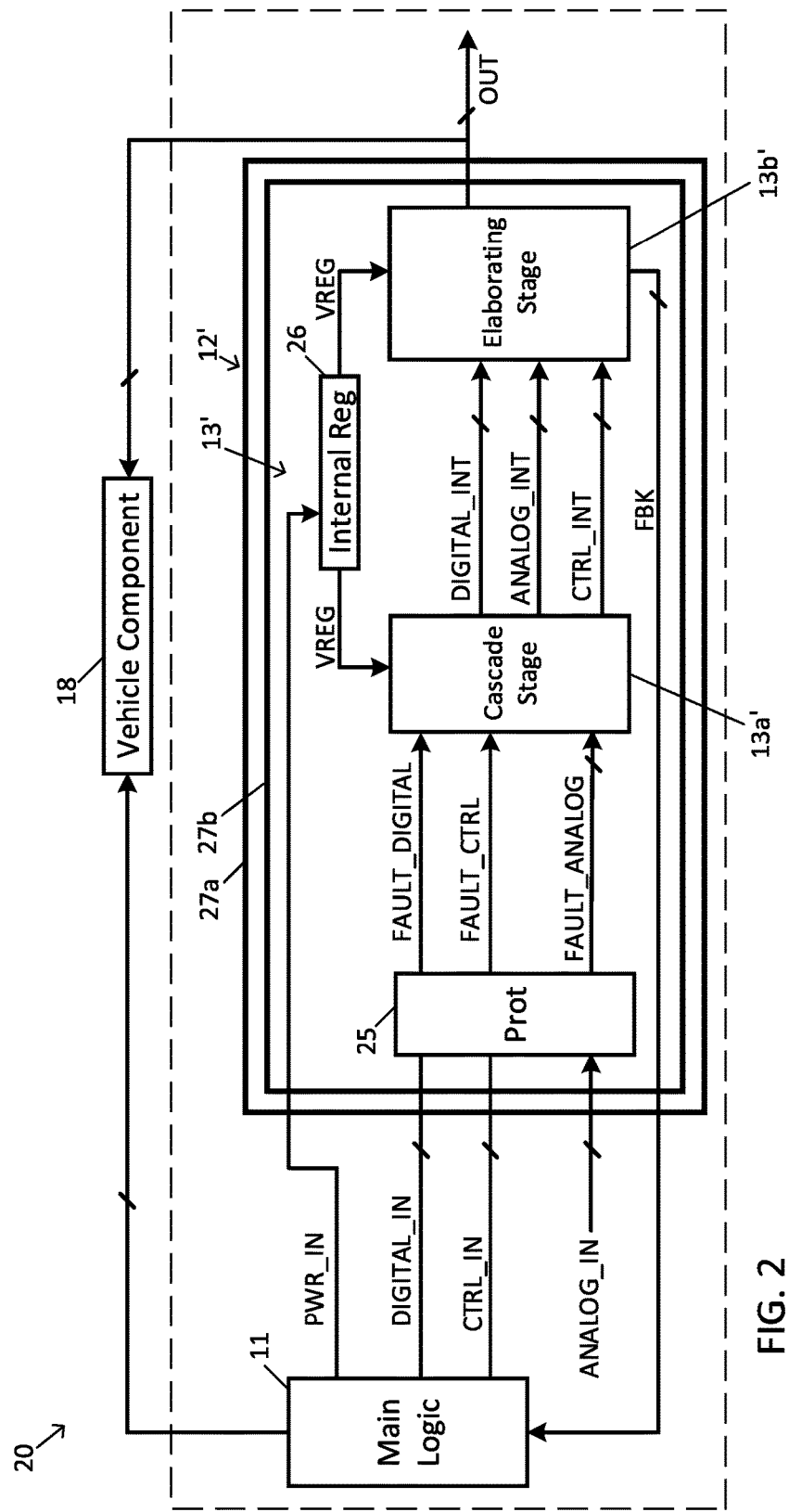
FIG. 2 is a block diagram of an vehicle system including an integrated circuit chip that includes an isolated safety area within the integrated circuit chip for verifying proper operation of main logic also within the integrated circuit chip, the isolated safety area including an internal voltage regulator for providing an internal protected supply voltage for safety circuits within the safety area, and the isolated safety area also including a protection circuits for protecting the safety circuits within the safety area from high voltage input signals.

Now described herein with reference to FIG. 2 is a vehicle system including a main logic 11 and a safety area 12' located within a single integrated circuit chip 20. A vehicle component 18, such as a transmission component, is external to the single integrated circuit chip 20.

The safety area 12' is located within an area of a silicon substrate surrounded on all sides by two concentric deep trench isolations 27a and 27b, with safety circuits 13' being located within the area enclosed by the deep trench isolation 27b, and with the deep trench isolation 27a surrounding the deep trench isolation 27b.

The safety circuits 13' are located within the safety area 12' so that signals traveling within the safety circuits 13' are protected from shorts to ground and shorts to the vehicle's battery voltage. Thus, the nested isolation features 27a and 27b (including but not limited to deep trench isolations) prevent external faults from propagating inside the safety area 12' to affect the safety circuits 13'.

The safety circuits 13' include, for example, a cascade stage 13a' and an elaborating stage 13b'. The cascade stage 13a' receives input from outside the safety area 12'. The elaborating stage 13b' receives input from the cascade stage 13a' and may also receive input from outside the safety area 12'. The elaborating stage 13b' may output one or more feedback signals FBK to the main logic 11 indicating whether or not an error with the operation of the main logic 11 has been detected. If a feedback signal FBK indicates that an error has been detected, the main logic 11 may take action, for example, by resetting or turning off the vehicle component 18 or a sub-component within the vehicle component 18, such as a valve driver.

One or more safety signals from outside the safety area 12' are received into the safety area 12' as input. One or more power signals PWR Ind. are received by an internal voltage regulator 26 over an external supply line, which generates (as will be described below in detail) an internal regulated voltage VREG for use in powering the cascade stage 13a' and elaborating stage 13b'. One or more analog signals ANALOG Ind. are also received into the safety area 12' via analog lines and are passed through a protection circuit 25 to produce (as will be described below in detail) analog fault signals FAULT_ANALOG, which are passed to the cascade stage 13a'. One or more digital signals DIGITAL_IN and one or more control signals CTRL_IN are also received into the safety area 12', passed through the protection circuit 25, to produce digital fault signals FAULT_DIGITAL and control fault signals FAULT_CTRL, which are received by the cascade stage 13a'.

The cascade stage 13a' processes its received input signals to produce the intermediate signals. The intermediate signals include one or more digital signals DIGITAL_INT, one or more digital representations of analog signals ANALOG_INT (produced from the analog fault signals FAULT_ANALOG), and one or more control signals CTRL_INT. The analog signals ANALOG_IN may have high voltages, for example on the order of 40V, and the protection circuit 25 converts the analog signals ANALOG_IN to diagnostic digital signals FAULT_ANALOG prior to evaluation thereof by the cascade stage 13a'.

The cascade stage 13a' may, for example, assert certain ones of the intermediate signals (to either an active high level or an active low level) when the input signals indicate an error has occurred within the main logic 11. For example, the safety circuits 13a' may assert one or more of the digital representations of the analog input signals ANALOG_INT if the corresponding analog input signal ANALOG_IN indicates a fault has occurred within the main logic 11, and the elaborating stage 13b' may assert one or more of the digital input signals DIGITAL_INT if the corresponding digital input signal DIGITAL_IN indicates a fault has occurred within the main logic 11.

The elaborating stage 13b' receives the intermediate signals, and generates therefrom the feedback signal FBK to the main logic 11, as well as generates therefrom outputs OUT to the vehicle component 18 that may, for example, directly reset or turn off the vehicle component 18 or a sub-component therein in response to detection of fault within the main logic 11.

Figure 3:
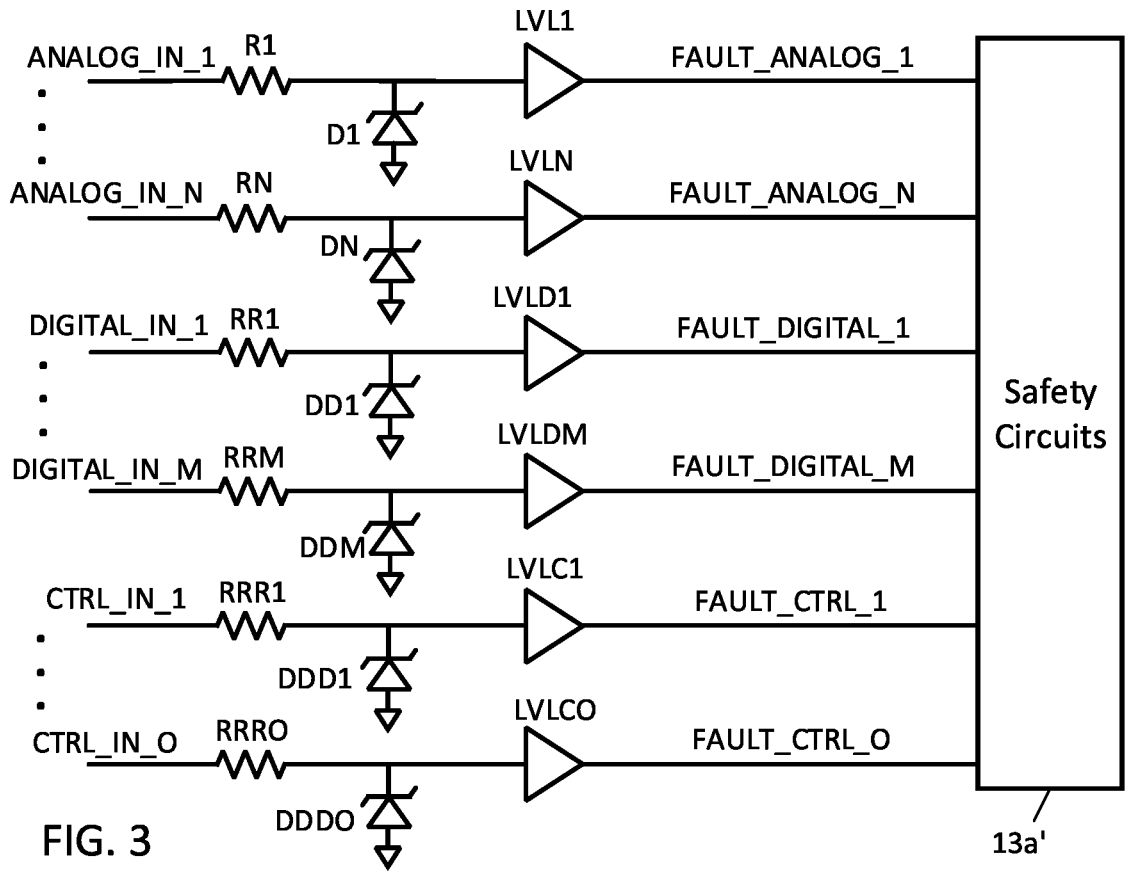
FIG. 3 is a schematic diagram of the protection circuits of FIG. 2.

Details of the protection circuit 25 are now given with additional reference to FIG. 3. For example here, the input analog signals ANALOG_IN here are shown as being multiple in number, from 1 to N, and so are represented as ANALOG_IN_1, . . . , ANALOG_IN_N. The input analog signal ANALOG_IN_1 is coupled by a resistor R1 to the input of a level shifter LVL1 that shifts the voltage domain of ANALOG_IN_1 down from, for example, 40V to 3.3V, outputting the result as FAULT_ANALOG_1. A Zener diode D1 has a cathode coupled at the tap between resistor R1 and level shifter LVL1 and an anode coupled to ground, with the purpose of D1 being to protect the level shifter LVL1 (and thus the cascade stage 13a') from shorts of ANALOG_IN_1 to a higher voltage. The input analog signal ANALOG_IN_N is coupled by a resistor RN to the input of a level shifter LVLN that shifts the voltage domain of ANALOG_IN_N down from, for example, 40V to 3.3V, outputting the result as FAULT_ANALOG_N. A Zener diode DN has a cathode coupled at the tap between resistor RN and level shifter LVLN and an anode coupled to ground, with the purpose of DN being to protect the level shifter LVLN (and thus the cascade stage 13a') from shorts of ANALOG_IN_N to a higher voltage. Each ANALOG_IN signal is digitally processed by the cascade stage 13a' dependent upon its voltage being positive or negative, with a positive voltage having a first meaning (e.g., that a fault is present), and with a negative voltage having a second meaning (e.g., that a fault is not present).

Note that N may be any number, so there may be any number of input analog signals ANALOG_IN, and any equal corresponding number of resistors R, Zener diodes D, and level shifters LVL, producing any number of analog fault signals FAULT_ANALOG. As stated earlier, the cascade stage 13a' receives as input the analog fault signals FAULT_ANALOG_1, . . . , FAULT_ANALOG_N.

The digital input signals DIGITAL_IN here are shown as being multiple in number, from 1 to M, and so are represented as DIGITAL_IN_1, . . . , DIGITAL_IN_M. The digital input signal DIGITAL_IN_1 is coupled by a resistor RR1 to an input of a level shifter or buffer LVLD1. A Zener diode DD1 has a cathode coupled to resistor RR1 and an anode coupled to ground, with the purpose of DD1 being to protect the cascade stage 13a' from shorts of DIGITAL_IN_1 to a higher voltage. The digital input signal DIGITAL_IN_M is coupled by a resistor RRM to an input of a level shifter or buffer LVLDM. A Zener diode DDM has a cathode coupled to resistor RRM and an anode coupled to ground, with the purpose of DDM being to protect the cascade stage 13a' from shorts of DIGITAL_IN_M to a higher voltage. Each DIGITAL_IN signal is digitally processed by the cascade stage 13a' dependent upon its voltage being logic high or low, with a logic high voltage having a first meaning (e.g., that a fault is present), and with a logic low voltage having a second meaning (e.g., that a fault is not present).

Note that M may be any number, so there may be any number of digital input signals DIGITAL_IN, and any equal corresponding number of resistors RR, level shifters or buffer LVLD and Zener diodes DD, producing any number of digital fault signals FAULT_DIGITAL. As stated earlier, the cascade stage 13a' receives as input the digital fault signals FAULT_DIGITAL_1, . . . , FAULT_DIGITAL_M.

The control signals CTRL_IN here are shown as being multiple in number, from 1 to O, and so are represented as CTRL_IN_1, . . . , CTRL_IN_O. The control signal CTRL_IN_1 is coupled by a resistor RRR1 to an input of a level shifter or buffer LVLC1. A Zener diode DDD1 has a cathode coupled to resistor RRR1 and an anode coupled to ground, with the purpose of DDD1 being to protect the cascade stage 13a' from shorts of CTRL_IN_1 to a higher voltage. The control signal CTRL_IN_O is coupled by a resistor RRRO to an input of a level shifter or buffer LVLCO. A Zener diode DDDO has a cathode coupled to resistor RRRO and an anode coupled to ground, with the purpose of DDDO being to protect the cascade stage 13a' from shorts of CTRL_IN_O to a higher voltage. Each CTRL_IN signal is digitally processed by the cascade stage 13a' dependent upon its voltage being logic high or low, with a logic high voltage having a first meaning (e.g., that a fault is present), and with a logic low voltage having a second meaning (e.g., that a fault is not present).

Note that O may be any number, so there may be any number of control signals CTRL_IN, and any equal corresponding number of resistors RRR, level shifters or buffer LVLC and Zener diodes DDD, producing any number of control fault signals FAULT_CTRL. As stated earlier, the cascade stage 13a' receives as input the control fault signals FAULT_CTRL_1, . . . , FAULT_CTRL_O.

Figure 4:
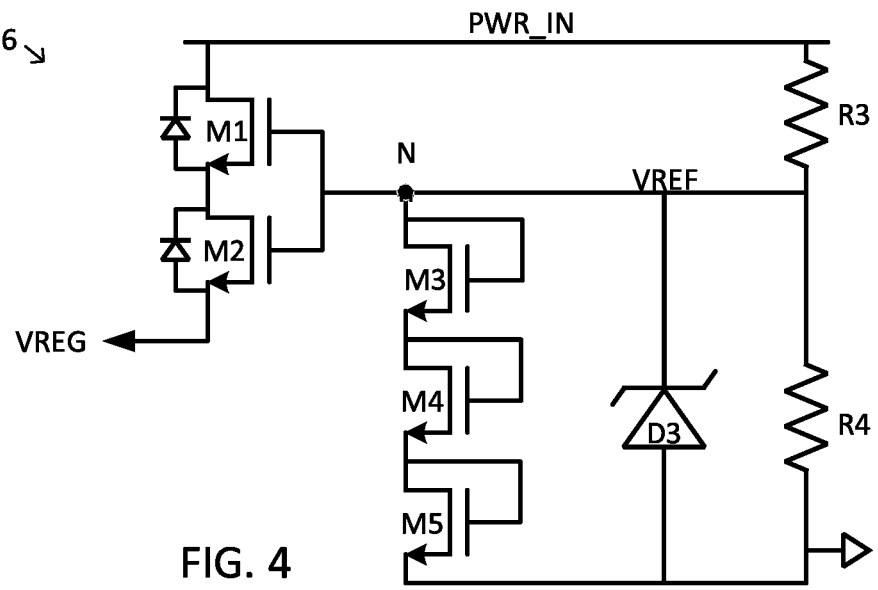
FIG. 4 is a schematic diagram of the internal voltage regulator.

Details of the internal voltage regulator 26 are now given with additional reference to FIG. 4. The internal voltage regulator 26 includes diode connected n-channel transistors M3, M4, and M5 coupled in series between node Nn and ground, with a resistor R4 coupled in parallel with the diode connected transistors M3, M4, and M5 between node Nn and ground. A Zener diode D3 is also coupled in parallel with the diode connected transistor M3, M4, and M5, and resistor R4 between node Nn and ground, with the cathode of the Zener diode D3 being coupled to node Nn and the anode of the Zener diode D3 being coupled to ground. A resistor R3 is coupled between the input power signal PWR Ind. and node Nn.

A cascode output stage formed from n-channel transistors M1 and M2 (which are high voltage NMOS transistors, for example) source-drain path coupled in series between the input power signal PWR_IN and an output node at which the internal regulated voltage VREG will be generated, with a drain of M1 being coupled to receive the input power signal PWR_IN and the source of M1 being coupled to the drain of M2, while the gate of M1 is coupled to the gate of M2. Likewise, the drain of M2 is coupled to the source of M1, and the source of M1 is coupled to the output node at which the internal regulated voltage VREG will be generated, while the gate of M2 is coupled to the gate of M1. The gates of both M1 and M2 are coupled to the node Nn.

The Zener diode D3 in conjunction with the diode coupled transistors M3-M5 serves to generate a reference voltage VREF at node Nn, with the Zener diode D3 providing a degree of protection in the instance that the external supply voltage PWR_IN to a high voltage. This reference voltage VREF serves to turn on the cascode, causing the transistors M1 and M2 to turn on to produce the internal regulated voltage VREG. Since the Zener diode D3 will quickly conduct a high current resulting from a short of the external supply voltage PWR_IN to a high voltage to ground, the internal regulated voltage VREG is protected from spiking in response to a spike in the external supply voltage PWR_IN. The cascode formed by M1 and M2 itself is produced from such a spike in the external supply voltage PWR_IN because the n-channel transistors M1 and M2 are high voltage transistors capable of withstanding a high voltage spike on PWR_IN.

Note that the diode D3 is represented as a Zener diode for simplicity, and in fact can be a Zener diode, but in some instances may have a band-gap like structure to provide for a particularly stable reference voltage VREF at node Nn.

Figure 5:
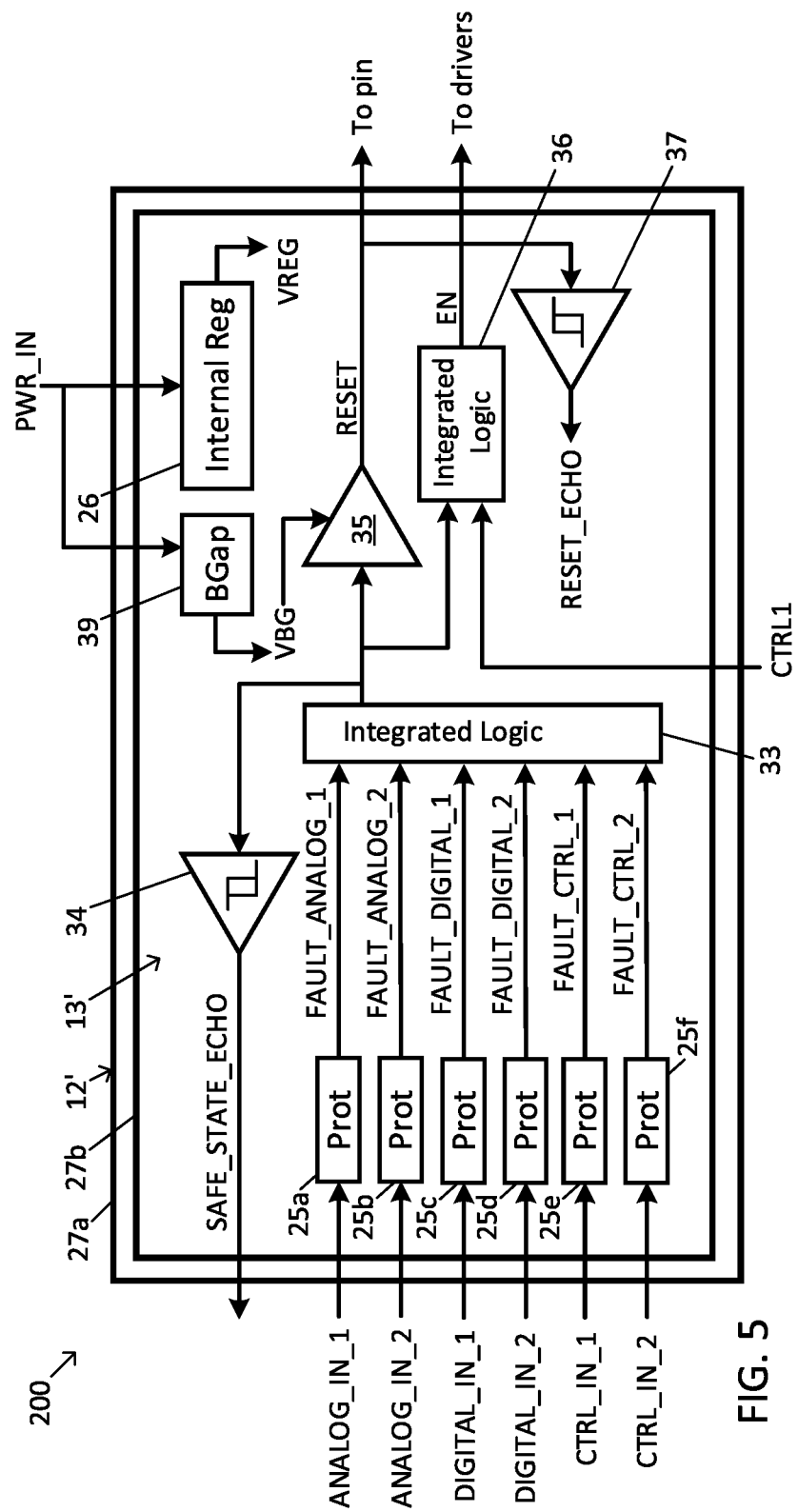
FIG. 5 is a block diagram of another embodiment of a vehicle system including an integrated circuit chip that includes an isolated safety area within the integrated circuit chip for verifying proper operation of main logic also within the integrated circuit chip, the isolated safety area including an internal voltage regulator for providing an internal protected supply voltage for safety circuits within the safety area, and the isolated safety area also including a protection circuits for protecting the safety circuits within the safety area from high voltage input signals.

A specific example of a safety area 200 is now described with reference to FIG. 5, merely for exemplary purposes, and this disclosure is in no way intended to be limited to this specific embodiment. The safety circuits 13' are located within the safety area 12' so that signals traveling within the safety circuits 13' are protected from shorts to ground and shorts to the vehicle's battery voltage. Thus, the nested deep trench isolations 27a and 27b prevent external faults from propagating inside the safety area 12' to affect the safety circuits 13'.

The safety area 12' includes an internal isolated voltage regulator 26 receiving an external supply voltage from outside the safety 12a' via a voltage supply line and generating an internal supply voltage VREG (for example, 5 V) for use in powering the safety circuits 13', and also includes an independent bandgap voltage generator 39 generating a bandgap voltage VBG (for example, 3.3 V) used for internal monitors within the safety area.

Protection circuits 25*a* and 25*b* receive input analog signals ANALOG_IN_1 and ANALOG_IN_2 via analog lines and protect them and other circuits within the safety areas 12' from shorts to a high voltage, and convert them to the analog fault signals FAULT_ANALOG_1 and FAULT_ANALOG_2 that are provided to an internal integrated logic 33. The protection circuits 25*a* and 25*b* have the same structure as was described with reference to FIG. 3.

The internal integrated logic circuit 33 also receives externally generated digital signals, DIGITAL_IN_1 and DIGITAL_IN_2 (which are passed through protection circuits 25*c*, 25*d* to produce the digital fault signals FAULT_DIGITAL_1 and FAULT_DIGITAL_2 and protect circuits within the safety areas 12' from shorts of DIGITAL_IN_1 and DIGITAL_IN_2 to a high voltage) and externally generated control signals CTRL_IN_1 and CTRL_IN_2 (which are passed through protection circuits 25*e*, 25*f* to produce the control fault signals FAULT_CTRL_1 and FAULT_CTRL2 and protect circuits within the safety areas 12' from shorts of CTRL_IN_1 and CTRL_IN_2 to a high voltage), from which it can be determined whether certain faults within the single integrated circuit chip 20 outside of the safety area 12' have occurred. The first digital fault signal FAULT_DIGITAL_1 may be a watchdog signal from the main logic, assertion of which may be indicative of a fault. The second digital fault signal FAULT_DIGITAL_2 may be an overcurrent detection signal from the main logic, de-assertion of which may be indicative of a fault. The internal integrated logic circuit 33 generates an output signal to a Schmitt trigger 34, which generates a safe state echo signal SAFE STATE ECHO therefrom, which may serve to inform the main logic when the safety circuits 13' have detected a fault with the main logic.

Output of the internal integrated logic circuit 33 is also applied to a buffer 35, which generates a reset signal RESET for usage to reset appropriate external circuits (external to the single integrated circuit chip 20) when the safety circuits 13' have detected a fault with the main logic. A Schmitt trigger 37 generates an echo of the reset signal RESET, labelled as RESET ECHO, which may be provided to the main logic to inform the main logic when a fault therein has occurred.

Output of the internal integrated logic circuit 33 is also provided to an integrated logic circuit 36, which also receives an external control signal CTRL1 as input, and from it generates an enable signal EN for vehicular components external to the single integrated circuit chip 20, such as valve drivers within the transmission. Thus, when a fault is detected, the enable signal EN is deasserted, so that the valve drivers cease to function.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. An integrated circuit chip, comprising:
an integrated circuit substrate;
main logic within the integrated circuit substrate, the main logic configured to control at least one external component, the main logic further configured to generate at least one digital signal from which proper operation of the main logic can be determined; and
a safety area within the integrated circuit substrate and isolated from the main logic, the safety area including:
an internal voltage regulator configured to receive an external supply voltage via an external supply voltage line and from it generate an internal regulated voltage, the internal voltage regulator configured to protect circuits within the safety area from shorts of the external supply voltage line to other voltages;
a protection circuit configured to receive at least one analog signal over an external analog input line and to generate at least one analog fault signal from the at least one analog signal by level shifting the at least one analog signal downward in voltage to produce at least one analog fault signal, the protection circuit configured to protect circuits within the safety area from shorts of the external analog input line to other voltages; and
safety circuits powered by the internal regulated voltage and configured to:
generate, from the at least one analog fault signal, at least one analog internal signal indicating whether improper operation of the main logic has occurred;
generate, from the at least one digital signal, at least one digital fault signal indicating whether improper operation of the main logic has occurred; and
generate, based upon the at least one analog internal signal and the at least one digital fault signal, an output signal that causes the at least one external component to perform a desired function in response to improper operation of the main logic, and a feedback signal that indicates that improper operation of the main logic has not occurred.

2. The integrated circuit chip of claim 1, wherein the protection circuit comprises an input resistor coupled to a level shifter, with a cathode of an avalanche diode being coupled to a tap between the input resistor and the level shifter and an anode of the avalanche diode being coupled to ground, wherein the level shifter is configured to shift the voltage of the at least one analog signal downward to produce the at least one analog fault signal.

3. The integrated circuit chip of claim 2, wherein the avalanche diode comprises a Zener diode.

4. The integrated circuit chip of claim 1, wherein the internal voltage regulator comprises:
a reference voltage generator connected between an internal node and ground, the internal node being coupled to the external supply voltage line, the reference voltage generator configured to generate a reference voltage from the external supply voltage on the external supply voltage line;
an avalanche diode coupled between the internal node and ground, the avalanche diode configured to protect the internal voltage regulator from shorts of the external supply voltage line to other voltages; and
a cascode circuit coupled to the reference voltage as input and configured to generate the internal regulated voltage from the external supply voltage.

5. The integrated circuit chip of claim 4, wherein the internal voltage regulator further comprises a voltage divider coupled between the external supply voltage line and ground, with a tap of the voltage divider being coupled to the internal node.

6. The integrated circuit chip of claim 4, wherein the internal voltage regulator further comprises a first resistor coupled between the external supply voltage line and the internal node, and a second resistor coupled between the internal node and ground.

7. The integrated circuit chip of claim 4, wherein the avalanche diode comprises a Zener diode.

8. The integrated circuit chip of claim 4, wherein the cascode circuit comprises:
a first transistor having a first conduction terminal coupled to the external supply voltage line, a second conduction terminal, and a control terminal coupled to the internal node; and
a second transistor having a first conduction terminal coupled to the second conduction terminal of the first transistor, a second conduction terminal at which the internal regulated voltage is produced, and a control terminal coupled to the internal node.

9. The integrated circuit chip of claim 4, wherein the cascode circuit comprises:
a first n-channel transistor having a drain coupled to the external supply voltage, a source, and a gate coupled to the internal node; and
a second n-channel transistor having a drain coupled to the source of the first n-channel transistor, a source coupled to ground, and a gate coupled to the internal node.

10. The integrated circuit chip of claim 4, wherein the reference voltage generator comprises a plurality of diode coupled transistors connected between the internal node and ground.

11. The integrated circuit chip of claim 4, wherein the reference voltage generator comprises:
a first n-channel transistor having a drain coupled to the internal node, a source, and a gate coupled to the internal node;
a second n-channel transistor having a drain coupled to the source of the first n-channel transistor, a source, and a gate coupled to the source of the first n-channel transistor; and
a third n-channel transistor having a drain coupled to the source of the second n-channel transistor, a source coupled to ground, and a gate coupled to the source of the second n-channel transistor.

12. The integrated circuit chip of claim 1, wherein the safety area is isolated by at least one deep trench isolation.

13. The integrated circuit chip of claim 1, wherein the safety area is isolated by at least two concentric deep trench isolations.

14. An integrated circuit chip, comprising:
an integrated circuit substrate;
main logic within the integrated circuit substrate, the main logic configured to control at least one external component; and
a safety area within the integrated circuit substrate and surrounded by at least one deep trench isolation, the safety area comprising:
an internal voltage regulator comprising:
a reference voltage generator connected between an internal node and ground, the internal node being coupled to an external supply voltage line to receive an external supply voltage, the reference voltage generator configured to generate a reference voltage from the external supply voltage on the external supply voltage line;
an avalanche diode coupled between the internal node and ground, the avalanche diode configured to protect the internal voltage regulator from shorts of the external supply voltage line to other voltages; and
a cascode circuit coupled to the reference voltage as input and configured to generate an internal regulated voltage from the external supply voltage;
a protection circuit comprising an input resistor coupled to a level shifter, with a cathode of an avalanche diode being coupled to a tap between the input resistor and the level shifter and an anode of the avalanche diode being coupled to ground, wherein the level shifter is configured to shift a voltage of at least one analog signal received over an external analog input line from outside the safety area downward to produce at least one analog fault signal; and
safety circuits powered by the internal regulated voltage and configured to indicate to the at least one external component whether the main logic has experienced a fault.

15. The integrated circuit chip of claim 14, wherein the internal voltage regulator further comprises a voltage divider coupled between the external supply voltage line and ground, with a tap of the voltage divider being coupled to the internal node.

16. The integrated circuit chip of claim 14, wherein the internal voltage regulator further comprises a first resistor coupled between the external supply voltage line and the internal node, and a second resistor coupled between the internal node and ground.

17. The integrated circuit chip of claim 14, wherein the avalanche diode comprises a Zener diode.

18. The integrated circuit chip of claim 14, wherein the cascode circuit comprises:
a first transistor having a first conduction terminal coupled to the external supply voltage line, a second conduction terminal, and a control terminal coupled to the internal node; and
a second transistor having a first conduction terminal coupled to the second conduction terminal of the first transistor, a second conduction terminal at which the internal regulated voltage is produced, and a control terminal coupled to the internal node.

19. The integrated circuit chip of claim 14, wherein the cascode circuit comprises:
a first n-channel transistor having a drain coupled to the external supply voltage, a source, and a gate coupled to the internal node; and
a second n-channel transistor having a drain coupled to the source of the first n-channel transistor, a source coupled to ground, and a gate coupled to the internal node.

20. The integrated circuit chip of claim 14, wherein the reference voltage generator comprises a plurality of diode coupled transistors connected between the internal node and ground.

21. The integrated circuit chip of claim 14, wherein the reference voltage generator comprises:
a first n-channel transistor having a drain coupled to the internal node, a source, and a gate coupled to the internal node;
a second n-channel transistor having a drain coupled to the source of the first n-channel transistor, a source, and a gate coupled to the source of the first n-channel transistor; and
a third n-channel transistor having a drain coupled to the source of the second n-channel transistor, a source coupled to ground, and a gate coupled to the source of the second n-channel transistor.

* * * * *